(12) United States Patent
Kris et al.

(10) Patent No.: US 11,686,571 B2
(45) Date of Patent: Jun. 27, 2023

(54) LOCAL SHAPE DEVIATION IN A SEMICONDUCTOR SPECIMEN

(71) Applicant: Applied Materials Israel Ltd., Rehovot (IL)

(72) Inventors: Roman Kris, Jerusalem (IL); Ilan Ben-Harush, Tel-Aviv (IL); Rafael Bistritzer, Petach Tikva (IL); Vadim Vereschagin, Ashdod (IL); Elad Sommer, Nes Harim (IL); Grigory Klebanov, Rishon-LeZion (IL); Arundeepth Thamarassery, Kozhikode (IN); Jannelle Anna Geva, Tel Aviv (IL); Gal Daniel Gutterman, Meitar (IL); Einat Frishman, Rehovot (IL); Sahar Levin, Or-Yehuda (IL)

(73) Assignee: Applied Materials Israel Ltd., Rehovot (IL)

( * ) Notice: Subject to any disclaimer, the term of this patent is extended or adjusted under 35 U.S.C. 154(b) by 104 days.

(21) Appl. No.: 17/465,753

(22) Filed: Sep. 2, 2021

(65) Prior Publication Data
US 2023/0069303 A1   Mar. 2, 2023

(51) Int. Cl.
*G01B 11/24* (2006.01)
*G01B 9/02* (2022.01)
*G06T 7/00* (2017.01)

(52) U.S. Cl.
CPC ..... *G01B 9/02043* (2013.01); *G01B 9/02084* (2013.01); *G01B 11/24* (2013.01); *G06T 7/001* (2013.01); *G06T 2207/30148* (2013.01)

(58) Field of Classification Search
CPC ............ G01B 9/02043; G01B 9/02084; G01B 11/24; G06T 7/001; G06T 2207/30148
See application file for complete search history.

(56) References Cited

U.S. PATENT DOCUMENTS

| | | | |
|---|---|---|---|
| 9,165,376 B2 | 10/2015 | Schwartzband et al. | |
| 2015/0016709 A1* | 1/2015 | Toyoda | G06F 18/28 382/149 |
| 2020/0065453 A1* | 2/2020 | Kim | G06F 30/398 |

OTHER PUBLICATIONS

Hong et al., "A high density and low cost staircase scheme for 3D NAND flash memory: SDS (stair divided scheme)", ECS Journal of Solid State Science and Technology, 8 (10), P567-P572, 2019, 7 pages.

(Continued)

*Primary Examiner* — Jonathan M Hansen
(74) *Attorney, Agent, or Firm* — Lowenstein Sandler LLP (57) ABSTRACT

There is provided a system and method of a method of detecting a local shape deviation of a structural element in a semiconductor specimen, comprising: obtaining an image comprising an image representation of the structural element; extracting, from the image, an actual contour of the image representation; estimating a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to local shape deviation of the actual contour; and performing one or more measurements representative of one or more differences between the actual contour and the reference contour, the measurements indicative of whether a local shape deviation is present in the structural element.

20 Claims, 5 Drawing Sheets

(56) References Cited

OTHER PUBLICATIONS

Kris et al., "Contact etch process control application for advanced NAND memory structures", In Metrology, Inspection, and Process Control for Microlithography XXXIV (vol. 11325, p. 113251F). International Society for Optics and Photonics, Mar. 2020, 8 pages.

Kris et al., "Macro CDSEM 2D metrology supporting advanced DRAM patterning", In Metrology, Inspection, and Process Control for Microlithography XXXIII (vol. 10959, p. 109592S), International Society for Optics and Photonics, Apr. 2019, 9 pages.

Jain, A. K. "Fundamentals of digital image processing", Prentice-Hall, Inc., 1989, pp. 370-374.

Kris et al., "Advanced 2D structures metrology with CD-SEM for OPC challenges", In Advanced Microlithography Technologies (vol. 5645, pp. 130-141) International Society for Optics and Photonics, Jan. 2005, 12 pages.

\* cited by examiner

LOCAL SHAPE DEVIATION IN A SEMICONDUCTOR SPECIMEN

TECHNICAL FIELD

The presently disclosed subject matter relates, in general, to the field of examination of a semiconductor specimen, and more specifically, to critical dimension (CD) metrology with respect to shape deviation in a specimen.

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Examination can be provided by using non-destructive examination tools during or after manufacture of the specimen to be examined. Examination generally involves generating certain output (e.g., images, signals, etc.) for a specimen by directing light or electrons to the wafer and detecting the photons or electrons from the wafer. A variety of non-destructive examination tools includes, by way of non-limiting example, scanning electron microscopes, atomic force microscopes, optical inspection tools, etc.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations, or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), automated metrology-related operations, etc.

Traditional critical dimension (CD) Metrology for process control is based on measurements of the geometric dimensions of basic features, such as lines and contacts. However, the conventional CD metrics for such features, such as average contact diameter, average width, average Manhattan size, etc., in some cases cannot provide the required correlations with electrical measurements in massive semiconductor device production. Thus, a new metrology metric for advanced process control is needed to be developed.

SUMMARY

In accordance with certain aspects of the presently disclosed subject matter, there is provided a computerized system of detecting a local shape deviation of a structural element in a semiconductor specimen, the system comprising a processing and memory circuitry (PMC) configured to obtain an image comprising an image representation of the structural element; extract, from the image, an actual contour of the image representation; estimate a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to the presence of local shape deviation of the actual contour; and perform one or more measurements representative of one or more differences between the actual contour and the reference contour, the measurements being indicative of whether a local shape deviation is present in the structural element.

In addition to the above features, the system according to this aspect of the presently disclosed subject matter can comprise one or more of features (i) to (ix) listed below, in any desired combination or permutation which is technically possible:

(i). The structural element has a shape selected from a group comprising: an ellipse, an oval, a rectangle, or a combination thereof (ii). The local shape deviation is represented by a local distortion of the actual contour having a relatively substantial deviation with respect to the standard shape of the structural element.

(iii). The semiconductor specimen is a memory device or a logic device.

(iv). The actual contour is extracted using an edge detection method.

(v). The loss function is Welsch loss function.

(vi). The estimating a reference contour comprises: extracting a first sequence of points from the actual contour, transforming the sequence of points to a Fourier series characterized by a set of Fourier coefficients, optimizing values of a subset of Fourier coefficients selected from the set of Fourier coefficients to minimize the loss function, the subset of Fourier coefficients with the optimized values constituting a Fourier descriptor of the reference contour, and performing an inverse Fourier transform using the Fourier descriptor, giving rise to a second sequence of points constituting the reference contour.

(vii). Each of the one or more measurements is indicative of a difference between a radius of the actual contour and a corresponding radius of the reference contour.

(viii). The PMC is further configured to apply a deviation threshold to the one or more measurements and report presence of a local shape deviation upon at least one measurement of the one or more measurements passing the deviation threshold.

(ix). The local shape deviation is caused by a physical effect during a fabrication process of the semiconductor specimen, which, upon being detected, affects one or more electrical measurements of the semiconductor specimen.

In accordance with other aspects of the presently disclosed subject matter, there is provided a method of detecting local shape deviation of a structural element in a semiconductor specimen, the method performed by a processing and memory circuitry (PMC) and comprising: obtaining an image comprising an image representation of the structural element; extracting, from the image, an actual contour of the image representation; estimating a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to presence of local shape deviation of the actual contour; and performing one or more measurements representative of one or more differences between the actual contour and the reference contour, the measurements indicative of whether a local shape deviation is present in the structural element.

This aspect of the disclosed subject matter can comprise one or more of features (i) to (ix) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of detecting local shape deviation of a structural element in a semiconductor specimen, the method comprising: obtaining an image comprising an image representation of the structural element; extracting, from the image, an actual contour of the image representation; estimating a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to presence of local shape deviation of the actual contour; and performing one or more measurements representative of one or more differences between the actual contour and the reference contour, the measurements indicative of whether a local shape deviation is present in the structural element.

This aspect of the disclosed subject matter can comprise one or more of features (i) to (ix) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "measuring", "obtaining", "extracting", "generating", "optimizing", "performing", "selecting", "transforming", "constituting", "applying", "reporting", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the metrology system and respective parts thereof disclosed in the present application.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include one or more of the following operations: runtime scanning (in a single or in multiple scans), sampling, reviewing, measuring, classifying and/or other operations provided with regard to the specimen or parts thereof, using the same or different examination tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "metrology" used in this specification should be expansively construed to cover any kind of measuring characteristics and features in a specimen provided by using examination and/or metrology tools during or after manufacture of the specimen to be inspected. By way of non-limiting example, the metrology process can include generating a measurement recipe and/or performing runtime measurement, for example by scanning (in a single or in multiple scans), reviewing, measuring and/or other operations provided with regard to the specimen or parts thereof using the same or different tools. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The terms "non-transitory memory" and "non-transitory storage medium" used herein should be expansively construed to cover any volatile or non-volatile computer memory suitable to the presently disclosed subject matter. The terms should be taken to include a single medium or multiple media (e.g., a centralized or distributed database, and/or associated caches and servers) that store the one or more sets of instructions. The terms shall also be taken to include any medium that is capable of storing or encoding a set of instructions for execution by the computer and that cause the computer to perform any one or more of the methodologies of the present disclosure. The terms shall accordingly be taken to include, but not be limited to, a read only memory ("ROM"), random access memory ("RAM"), magnetic disk storage media, optical storage media, flash memory devices, etc.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Figure 1:
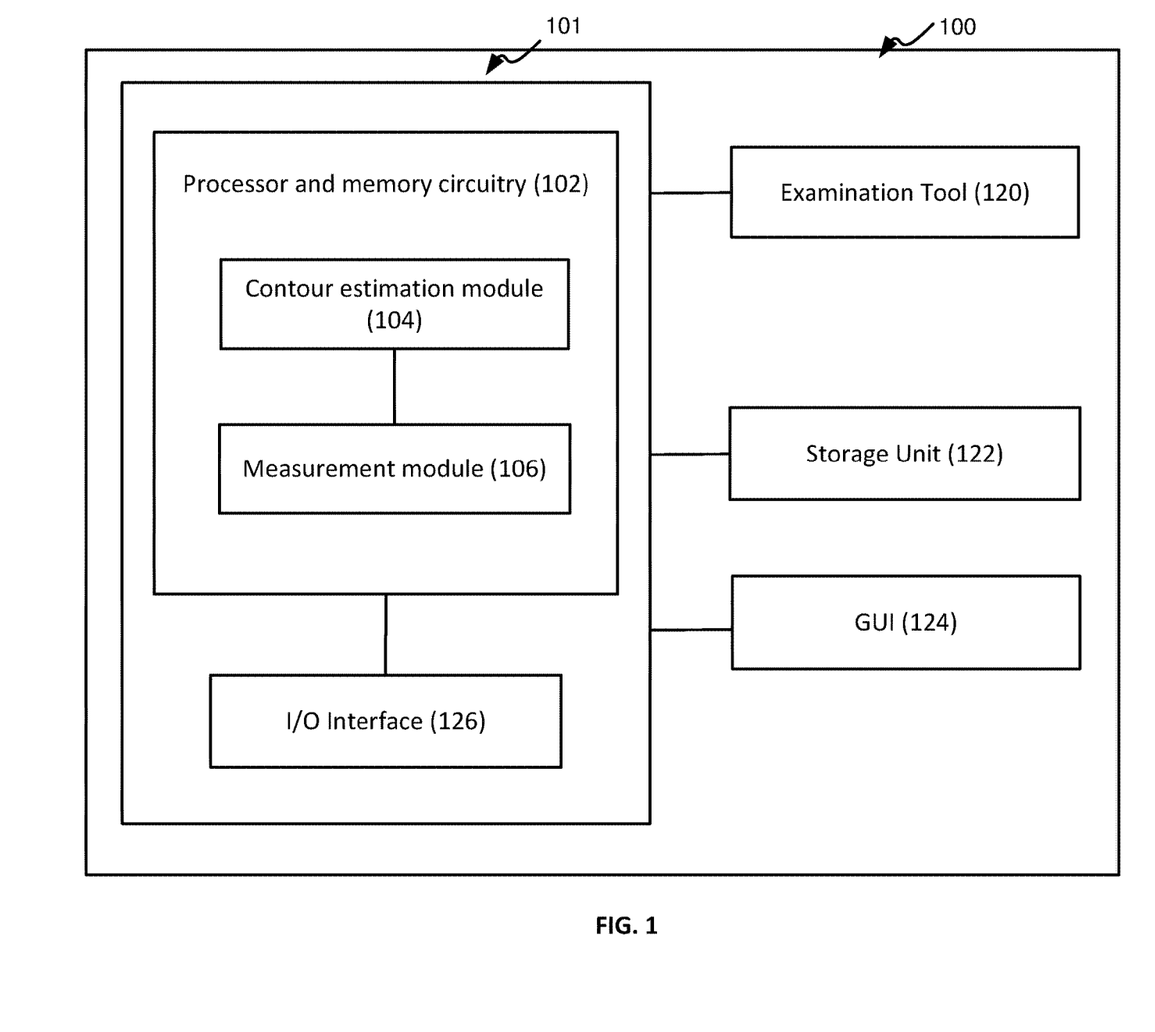
FIG. 1 illustrates a generalized block diagram of an examination system in accordance with certain embodiments of the presently disclosed subject matter.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g., of a wafer and/or parts thereof) as part of the specimen fabrication process. As described above, the examination referred to herein can be construed to cover any kind of metrology-related operations, as well as operations related to detection and/or classification of defects in a specimen during its fabrication. According to certain embodiments of the presently disclosed subject matter, the illustrated examination system 100 comprises a computer-based system 101 capable of automatically performing one or more metrology operations on images obtained during specimen fabrication. System 101 is also referred to as a metrology system, which is a sub-system of the examination system 100. Specifically, according to certain embodiments, the metrology operations can include critical dimension (CD) measurements with respect to local shape deviation in a semiconductor specimen.

System 101 can be operatively connected to one or more examination tools 120 configured to scan a semiconductor specimen and capture images thereof for examination of the specimen. In some embodiments, at least one of the examination tools 120 has metrology capabilities and can be configured to perform metrology operations on the captured images. Such an examination tool is also referred to as a metrology tool.

The term "metrology operation" used in this specification should be expansively construed to cover any metrology operation procedure used to extract metrology information relating to one or more structural elements on a semiconductor specimen. By way of example, metrology information to be extracted can be indicative of one or more of the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. In some embodiments, the metrology operations can include measurement operations, such as, e.g., CD measurements performed with respect to certain structures on the specimen.

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof.

By way of example, a specimen can be examined by one or more low-resolution examination tools (e.g., an optical inspection system, low-resolution SEM, etc.). The resulting data (referred to as low-resolution image data), informative of low-resolution images of the specimen, can be transmitted—directly or via one or more intermediate systems—to system 101. Alternatively, or additionally, the specimen can be examined by a high-resolution tool (e.g., a Scanning Electron Microscope (SEM) or Atomic Force Microscopy (AFM) or Transmission Electron Microscope (TEM)). The resulting data (referred to as high-resolution image data), informative of high-resolution images of the specimen, can be transmitted—directly or via one or more intermediate systems—to system 101.

Without limiting the scope of the disclosure in any way, it should also be noted that the examination tools 120 can be implemented as examination machines of various types, such as optical imaging machines, electron beam machines, and so on. In some cases, the same examination tool can provide low-resolution image data and high-resolution image data.

According to certain embodiments, one of the examination tools is an electron beam tool, such as, e.g., scanning electron microscopy (SEM). SEM is a type of electron microscope that produces images of a specimen by scanning the specimen with a focused beam of electrons. The electrons interact with atoms in the specimen, producing various signals that contain information on the surface topography and/or composition of the specimen. The position of the beam is combined with the intensity of the detected signal to produce an image. SEM is capable of accurately measuring features during the manufacture of semiconductor wafers. By way of example, the SEM tool can be critical dimension scanning electron microscopes (CD-SEM) used to measure critical dimensions of structural features in the images.

System 101 includes a processor and memory circuitry (PMC) 102 operatively connected to a hardware-based I/O interface 126. PMC 102 is configured to provide processing necessary for operating the system as further detailed with reference to FIGS. 2 and 3, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

The processor referred to herein can represent one or more general-purpose processing devices such as a microprocessor, a central processing unit, or the like. More particularly, the processor may be a complex instruction set computing (CISC) microprocessor, a reduced instruction set computing (RISC) microprocessor, a very long instruction word (VLIW) microprocessor, or a processor implementing other instruction sets, or processors implementing a combination of instruction sets. The processor may also be one or more special-purpose processing devices such as an application specific integrated circuit (ASIC), a field programmable gate array (FPGA), a digital signal processor (DSP), a network processor, or the like. The processor is configured to execute instructions for performing the operations and steps discussed herein.

The memory referred to herein can comprise a main memory (e.g., read-only memory (ROM), flash memory, dynamic random access memory (DRAM) such as synchronous DRAM (SDRAM) or Rambus DRAM (RDRAM), etc.), and a static memory (e.g., flash memory, static random access memory (SRAM), etc.).

As aforementioned, in some embodiments, system 101 can be configured to detect a local shape deviation of a structural element in a semiconductor specimen. A local shape deviation (also termed as striation) used herein refers to a local distortion or deformation that has a relatively substantial deviation with respect to a standard contour or ideal contour of the structural element. This is in contrast to a global deviation, which refers to an overall deformation that is applied globally or systematically to a structural element, such as, e.g., an overall expansion of the diameters of a structural element, etc.

A structural element or structural feature used herein can refer to any original object on the specimen that has a geometrical shape or geometrical structure with a contour, in some cases combined/superimposed with other object(s) (therefore forming a pattern). Examples of structural elements can include, but not limited to, general shape features, such as, e.g., contacts, lines, etc.

The local shape deviation referred to herein may be caused by a physical effect during a fabrication process of the semiconductor specimen. Such a local deviation, upon being detected, may influence certain electrical measurements of the semiconductor specimen, thus potentially affecting yield.

By way of example, a local deformation can appear in the pillars of Vertical NAND (V-NAND) (also referred to as 3D-NAND) device after an etching process. V-NAND is a type of non-volatile flash memory where the memory cells are stacked vertically in multiple layers. The etching process can cause deformities to the sidewall of the pillars in the V-NAND device, which may appear as rounded dents or pointed protrusions. Such striation may reduce the electrical barrier between cells, thus causing electrical shorts and affecting the device performance.

The current CD metrology measurements for process control of such structural features are based on a set of geometric parameters defining the shape of the structural features. In the example of a contact, such parameters can include, e.g., contact top diameter (also referred to as top CD), contact bottom diameter (also referred to as bottom CD), ellipticity, minor axis and major axis, etc. However, with the development of advanced processes and massive production of complex features, these measurements are not sufficient for controlling the process steps of such features.

For instance, in the above example of local deviation occurring in the advanced 3D-NAND staircase formation process, contacts with the same geometric parameters, but with different local shape deviations, cannot be identified by conventional CD metrology measurement procedures. In other words, contacts with an ideal shape and those with local shape deviations may have the same average contact diameters using the current CD metrology metrics, thus cannot be told apart.

Therefore, in cases where process control requires sophisticated analysis of local deviations from ideal shapes, new metrology metrics are required in order to be able to detect and measure such deviations. According to certain embodiments of the presently disclosed subject matter, there is proposed a new metrology method of detecting local shape deviation of a structural element with respect to its standard/ideal shape, based on an optimization method. The proposed metrology method provides better correlation with electrical measurements for advanced process control, and has been proven to have improved accuracy with respect to detection of local shape deviation and measurement of the deviation.

According to certain embodiments of the presently disclosed subject matter, the functional modules comprised in PMC 102 of system 101 can include a contour estimation module 104 and a measurement module 106. The PMC 102 can be configured to obtain, via I/O interface 126, an image comprising an image representation of the structural element. The image can be acquired by the examination tool 120, such as a CD-SEM tool. The contour estimation module 104 can be configured to extract, from the image, an actual contour of the image representation. The contour estimation module 104 can be further configured to estimate a reference contour of the image representation indicative of a standard shape of the structural element. The reference contour can be estimated based on a Fourier descriptor representative of the reference contour. The Fourier descriptor is estimated using an optimization method based on a loss function specifically selected to be insensitive to presence of local shape deviation of the actual contour.

The measurement module 106 can be configured to perform one or more measurements representative of one or more differences between the actual contour and the reference contour. The measurements can be indicative of whether a local shape deviation is present in the structural element.

Operations of systems 100, 101, PMC 102 and the functional modules therein, will be further detailed with reference to FIGS. 2 and 3.

According to certain embodiments, system 101 can comprise a storage unit 122. The storage unit 122 can be configured to store any data necessary for operating systems 100 and 101, e.g., data related to input and output of systems 100 and 101, as well as intermediate processing results generated by system 101. By way of example, the storage unit 122 can be configured to store the image(s) produced by the examination tool 120 and/or derivatives thereof. Accordingly, the image(s) can be retrieved from the storage unit 122 and provided to the PMC 102 for further processing.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including images of the specimen and/or image representation of the structural element. The user may be provided, through the GUI, with options of defining certain operation parameters. In some cases, the user may also view operation results, such as the one or more measurements, and/or further examination results on the GUI.

As described above, system 101 is configured to receive, via I/O interface 126, one or more images of the specimen. The images can include image data (and/or derivatives thereof) produced by the examination tools 120 and/or image data stored in the storage unit 122 or one or more data depositories. In some cases, image data can refer to images captured by the examination tools during the manufacturing process, and/or pre-processed images derived from the captured images as obtained by various pre-processing stages, etc. It is noted that in some cases the images can include associated numeric data (e.g., metadata, hand-crafted attributes, etc.). It is further noted that the image data can include data related to a layer of interest in the specimen and/or data related to multiple layers of the specimen.

System 101 is further configured to process the received images and send, via I/O interface 126, the results (e.g., the CD measurements on the image) to the storage unit 122, and/or the examination tool 120.

In some embodiments, additionally to the examination tool 120, the examination system 100 can comprise one or more examination modules, such as, e.g., defect detection module and/or Automatic Defect Review Module (ADR) and/or Automatic Defect Classification Module (ADC) and/or a metrology-related module and/or other examination modules which are usable for examination of a semiconductor specimen. The one or more examination modules can be implemented as stand-alone computers, or their functionalities (or at least part thereof) can be integrated with the examination tool 120. In some embodiments, the measurement as obtained from system 101 can be used by the examination tool 120 and/or the one or more examination modules (or part thereof) for further examination of the specimen.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with one or more examination tools 120, thereby facilitating and enhancing the functionalities of the examination tools 120 in examination-related processes.

Figure 2:
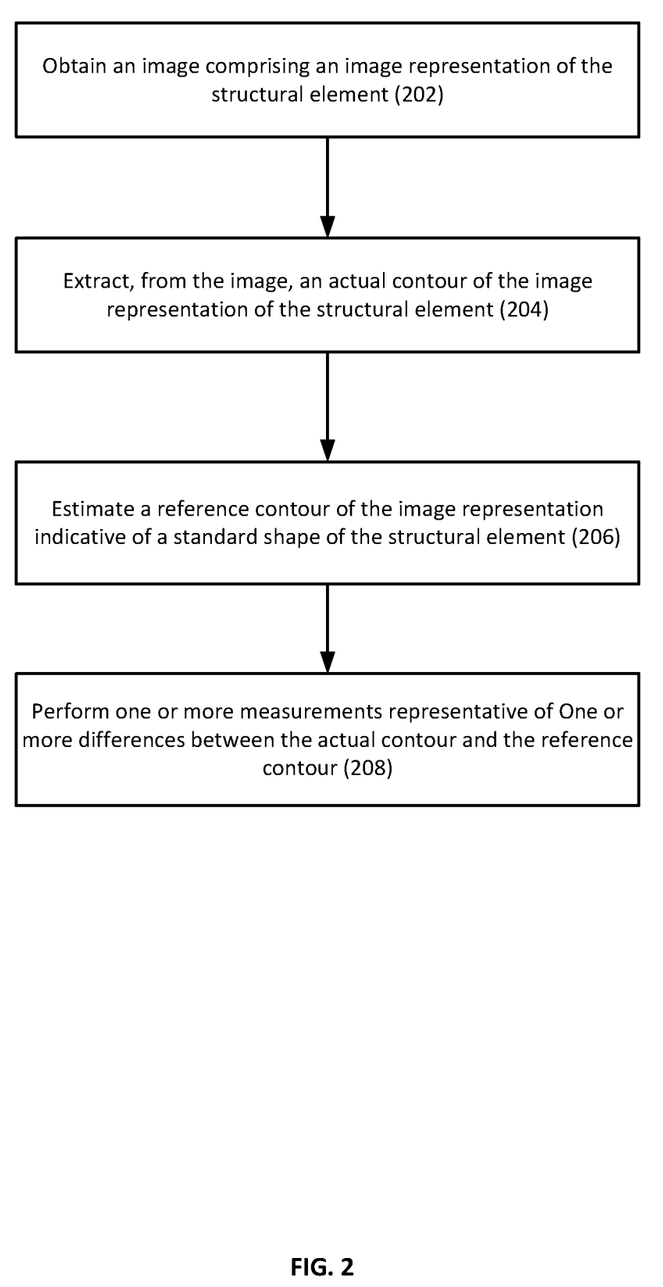
FIG. 2 illustrates a generalized flowchart of identifying a local shape deviation of a structural element in a semiconductor specimen in accordance with certain embodiments of the presently disclosed subject matter.
Figure 3:
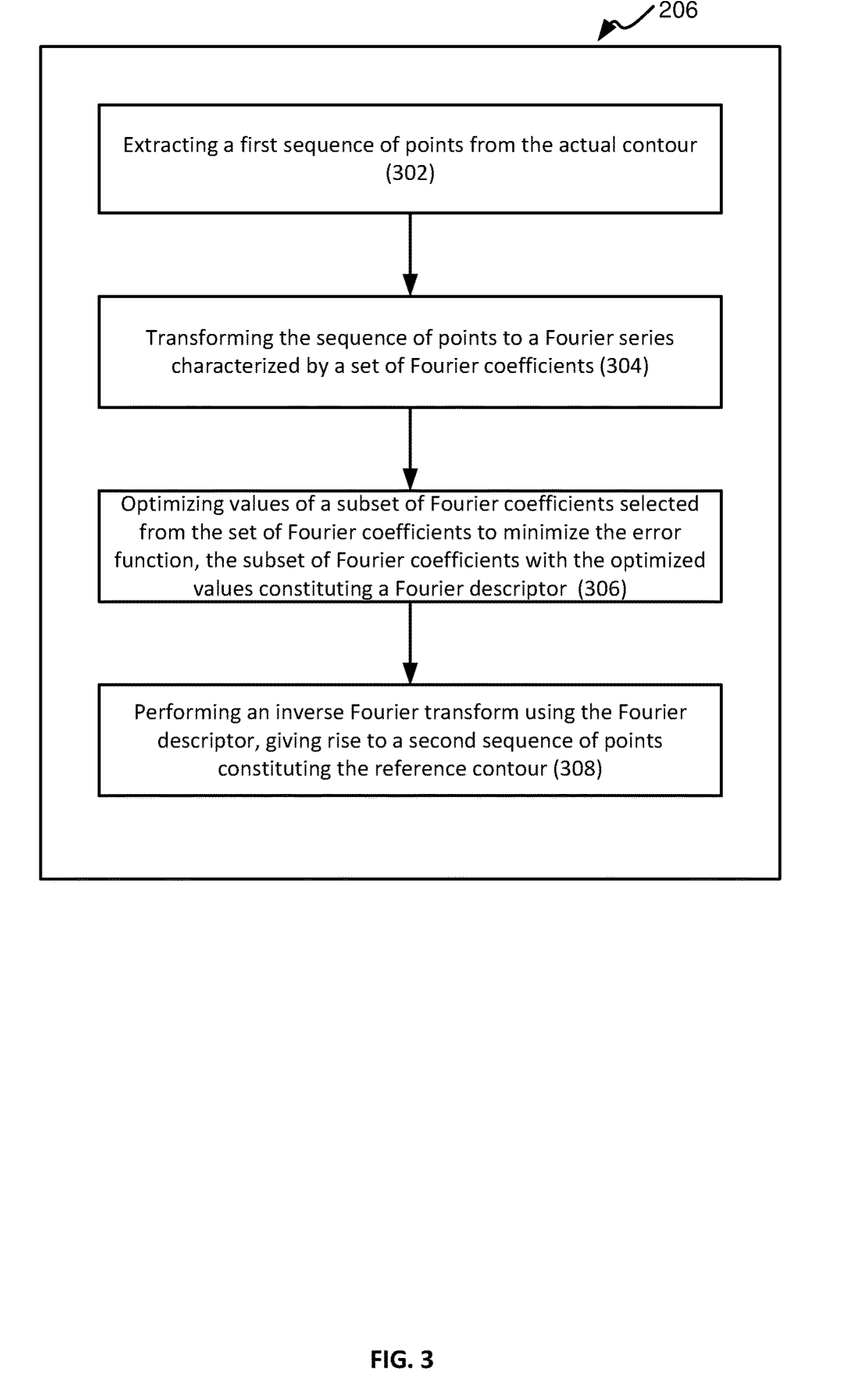
FIG. 3 illustrates a generalized flowchart of estimating a reference contour of a structural element in a semiconductor specimen in accordance with certain embodiments of the presently disclosed subject matter.

While not necessarily so, the process of operation of systems 101 and 100 can correspond to some or all of the stages of the methods described with respect to FIGS. 2-3. Likewise, the methods described with respect to FIGS. 2-3 and their possible implementations can be implemented by systems 101 and 100. It is therefore noted that embodiments discussed in relation to the methods described with respect to FIGS. 2-3 can also be implemented, mutatis mutandis as various embodiments of the systems 101 and 100, and vice versa.

Referring now to FIG. 2, there is illustrated a generalized flowchart of identifying a local shape deviation of a structural element in a semiconductor specimen in accordance with certain embodiments of the presently disclosed subject matter.

An image of the specimen can be obtained (202) (e.g., by the PMC 102 via I/O interface 126, from the examination tool(s) 120 or from the storage unit 122), comprising an image representation of the structural element (also referred to as image structural element) in the specimen. In some embodiments, the image can be acquired by an electron beam tool, such as SEM. For instance, the SEM tool used herein can be critical dimension scanning electron microscopes (CD-SEM) configured to measure critical dimensions of structural elements/features of a specimen based on the captured images. In some embodiments, the image can pertain to a specific layer of interest of the specimen. For instance, in the 3D-NAND device as described above, the memory cells are stacked vertically in multiple layers. The elastic tensions during fabrication process can cause deformities to certain device layers, which can be subject to the presently disclosed local deviation detection process.

As described above, a structural element can refer to any original object formed on the specimen that has a geometrical shape or geometrical structure with a contour, and/or a pattern combined/superimposed by a plurality of such original objects. In some embodiments, the structural element can refer to any feature that has a general shape selected from a group comprising: an ellipse, an oval, a rectangle, or any superposition/combination thereof. Examples of structural elements can include general shape features, such as, e.g., contacts, lines, etc. The structural element can be a 2D or 3D feature, and the image representation can reflect a 2D representation of the structural element.

The semiconductor specimen that is applicable to the presently disclosed method can be any kind of semiconductor devices including memory devices and/or logic devices that may suffer from local shape deviation as described herein. The present disclosure is not limited to a specific type or functionality of the semiconductor specimen.

For exemplary and illustrative purposes, certain embodiments and/or examples of the presently disclosed subject matter herein are described with respect to a structural element of a contact. This is by no means intended to limit the present disclosure in any way. It is appreciated that the proposed methods and systems can be applied to other types of structural elements with various shapes as described herein.

An actual contour of the image representation of the structural element can be extracted (204) (e.g., by the contour estimation module 104 of PMC 102) from the image. In some embodiments, the actual contour of the image structural element can be extracted using an edge detection method. By way of example, the edge detection method can be implemented as the Canny or Sobel edge detection algorithm. Another example of an edge detection algorithm applicable to the present subject matter is described in U.S. Pat. No. 9,165,376 titled "System, method and computer readable medium for detecting edges of a pattern" which is assigned to the assignee of the present patent application and incorporated herein in its entirety by reference. By way of another example, the edge detection method can be implemented by using a segmentation algorithm based on gray-level statistical analysis of the image.

A reference contour of the image representation can be estimated (206) (e.g., by the contour estimation module 104 of PMC 102). The reference contour is indicative of a standard shape of the structural element. The standard shape refers to an ideal shape or a regular/normal shape of the structural element as expected according to its original design, without presence of any local deviation. In some embodiments, the reference contour can be estimated based on a Fourier descriptor representative of the reference contour. Specifically, the Fourier descriptor can be estimated using an optimization method based on a loss function specifically selected to be insensitive to the presence of local shape deviation of the actual contour.

As described above, local shape deviation refers to a local distortion or deformation that has a relatively substantial deviation with respect to a standard shape or normal shape of the structural element. Local shape deviation differs from edge roughness (which may be caused by different variations in the fabrication process) in that the shape deviation is local, whereas the edge roughness is present along all the edges, and the amplitude of the deviation is relatively more substantial (i.e., stronger/larger) as compared to the subtle roughness along the edges.

Such local deviations may be caused, in some cases, by a physical effect during the fabrication process of the specimen, such as, e.g., elastic tensions in certain layers of a semiconductor specimen/device, and may affect electrical measurements, thus possibly causing device performance failure and yield decrease. Therefore, it is regarded as a type of defect, and it is necessary to detect such deviation defects and measure the amplitude thereof.

In order to measure the deviation from a standard shape of the structural element, a reference contour indicative of the standard shape of the structural element needs to be estimated in the presence of the deviation. In particular, the estimation of the reference contour has to be robust, i.e., insensitive to such relatively large deviations, so as to be able to provide an estimated reference contour which can be representative of the standard shape, irrespective of the presence of such local deviations. Certain existing estimation methods, such as Least square estimation, etc., are used for this purpose, which, however, do not meet the required robustness with respect to such local deviations.

According to certain embodiments of the presently disclosed subject matter, there is proposed a new way to provide a robust estimation of the reference contour of a structural element which is insensitive to local shape deviations. Specifically, the reference contour can be estimated based on a Fourier descriptor representative of the reference contour. The Fourier descriptor can be estimated using an optimization method based on a loss function specifically selected to be insensitive to the local shape deviation of the actual contour.

A Fourier descriptor (FD) can be generated utilizing signal harmonic analysis (i.e., representation of functions or signals as the superposition of basic waves such as sines and cosines). The FD can be used to represent a 2D closed shape/contour of a structural element through a periodic structure of the contour, thereby describing the contour using representation of Fourier components. By way of example, an elliptic shape of a structural element can be represented using two Fourier components (corresponding to a FD of two Fourier coefficients), and a non-elliptic shape of a structural element can be typically represented using five to seven Fourier components (corresponding to a FD of five to seven Fourier coefficients). Therefore, the FD can be estimated by identifying the Fourier components with their optimized weights (i.e., the Fourier coefficients).

Turning now to FIG. 3, there is illustrated a generalized flowchart of estimating a reference contour of a structural element in a semiconductor specimen in accordance with certain embodiments of the presently disclosed subject matter.

A first sequence of points can be extracted (302) from the actual contour. By way of example, a sequence of points $<x[i], y[i]>$ (i=1, 2, ... n) can be extracted from the actual contour. The sequence $<x[i], y[i]>$ (i=1, 2, ... n) represents the coordinates of n pixels on the actual contour of the image structural element. The sequence can be represented in the form of complex numbers $x[i]+j*y[i]$, which can be transformed (304) to a Fourier series comprising a set of Fourier components characterized by a set of Fourier coefficients. By way of example, a sequence of n points extracted from the actual contour can be transformed to a Fourier series comprising a set of n Fourier components characterized by a set of n Fourier coefficients.

In some embodiments, the sequence of points $<x[i], y[i]>$ can be first transformed to polar coordinates $<R[i], \varphi[i]>$ (e.g., by computing the center of gravity (COG) of the actual contour and using the COG as the center of the polar coordinate system), where $R(\varphi)$ is a periodic function. The sequence in polar coordinates can be then transformed (304) to a Fourier series comprising a set of Fourier components characterized by a set of Fourier coefficients. One example of such Fourier series can be formulated as follows:

$$R(\varphi)=a_0+a_1 \cos(2\pi\varphi)+b_1 \sin(2\pi\varphi)+ \ldots +a_K \cos(2\pi K\varphi)+b_K \sin(2\pi K\varphi)+ \ldots$$

According to certain embodiments, a subset of Fourier coefficients: $[a_0, a_1 \ldots a_K, b_1 \ldots b_K]$ can be selected from the set of Fourier coefficients characterizing the Fourier series. The Fourier descriptor (FD) can be represented by the subset of Fourier coefficients: $[a_0, a_1 \ldots a_K, b_1 \ldots b_K]$. By way of example, the number of Fourier coefficients K as included in the subset can be predetermined. For instance, K can correspond to the low frequency components of the Fourier series. As exemplified above, a non-elliptic shape of a structural element can be typically represented using five to seven Fourier components (corresponding to five to seven Fourier coefficients). In some cases, K can also be determined based on a specific shape of the contour.

In order to estimate the FD which can accurately represent the contour, the values of the Fourier coefficients need to be optimized, e.g., using an optimization method. In some embodiments, the values of the subset of Fourier coefficients can be optimized (306) in the optimizing process to minimize a loss function, and the subset of Fourier coefficients with the optimized values can constitute the Fourier descriptor representative of the reference contour. An inverse Fourier transform can be performed (308) using the Fourier descriptor, giving rise to a second sequence of points constituting the reference contour.

As mentioned above, the loss function used for the optimization is specifically selected to be insensitive to the presence of local shape deviation of the actual contour. Indeed, when estimating a standard shape of a structural element, a robust loss function may be preferred over a non-robust loss function, due to its reduced sensitivity to large errors/deviations (i.e., robust to the local shape deviation referred to herein), which can be used to perform an estimation that is less influenced by outliers than by inliers.

One example of a non-robust loss function is the Least squared error (LSE) or the Mean squared error (MSE) that is highly sensitive towards large errors (outliers) and an estimated fit based on such loss function is heavily influenced by the outliers. One example of a robust loss function which is less sensitive to outliers is the Welsch loss function. Such robust loss functions can be designed by utilizing various robust penalties with particular properties.

Assume a Fourier descriptor (FD) is estimated as the subset of Fourier coefficients: $[a_0, a_1 \ldots a_K, b_1 \ldots b_K]$. Let $<r \varphi[i]>$ be the second sequence of points estimated through the inverse Fourier transform from the FD $[a_0, a_1 \ldots a_K, b_1 \ldots b_K]$, as formulated below:

$$r(\varphi)=a_0+a_1 \cos(2\pi\varphi)+b_1 \sin(2\pi\varphi)+ \ldots +a_K \cos(2\pi K\varphi)+b_K \sin(2\pi K\varphi)$$

The Welsch loss function based on the R($\varphi$) and r($\varphi$) can be formulated as follows:

$$\text{Error}_{welsch}(a_0, a_1 \ldots a_K, b_1 \ldots b_K) = \sum_{n=1}^{N}\left(1 - \exp\left(-\frac{(R(\varphi) - r(\varphi))^2}{\sigma^2}\right)\right)$$

By way of example, the optimization method can be implemented as a first-order (gradient-based) line search optimization scheme. A first coarse fit with initial values of the subset of Fourier coefficients can be computed and used as the initial starting point for the optimization. In each iteration, a gradient can be calculated at the starting point, and a descent direction (e.g., the anti-gradient direction), along which the loss function will be sufficiently reduced, is identified. A step size is computed which determines how far to move along that direction. Upon moving along the descent direction with the determined step size, a new starting point is derived and used to start the next iteration. The iterations can be repeated until reaching a convergence (i.e., the error of the loss function reached its minimum). The subset of Fourier coefficients [$a_0, a_1 \ldots a_K, b_1 \ldots b_K$] with the optimized values that enables the minimization of the loss function becomes the Fourier descriptor (FD) representative of the standard contour.

The inverse Fourier transform can be performed using the FD [$a_0, a_1 \ldots a_K, b_1 \ldots b_K$] with the optimized values, giving rise to the second sequence of points <r [i], $\varphi$[i]> which constitutes the estimated reference contour.

It is to be noted that the Welsch loss function (and the specific formulation thereof) as illustrated above is just one example of robust loss functions that can be used in the present disclosure for performing estimation of the reference contour. Other robust loss functions, such as, e.g., Cauchy-Lorentzian, Geman-McClure, Charbonnier, etc., can be used in combination with, or in lieu of, the above example.

Continuing with the description of FIG. 2, once the reference contour of the image structural element is estimated, as described above with reference to block 206 and FIG. 3, one or more measurements representative of one or more differences between the actual contour and the reference contour can be performed (208) (e.g., by the measurement module 106 of PMC 102). The measurements are indicative of whether a local shape deviation (e.g., at least one local shape deviation) is present in the structural element. The local deviation as detected and measured using the presently proposed method has improved accuracy as compared to other estimation methods.

By way of example, the one or more measurements can be performed at one or more points/pixels of the actual contour, and each measurement can be indicative of a difference between a radius of the actual contour (e.g., from the center of gravity (COG) of the reference contour to the one or more points/pixels) and a corresponding radius of the reference contour (e.g., from the COG of the reference contour to one or more corresponding points/pixels on the reference contour).

In some embodiments, a deviation threshold can be applied to the one or more measurements and the presence of a local shape deviation can be reported upon a measurement of the one or more measurements passing the deviation threshold. For instance, a deviation threshold of 1 nm can be predefined, and any measurement of a difference that is larger than the threshold should be reported to the customer.

Figure 4:
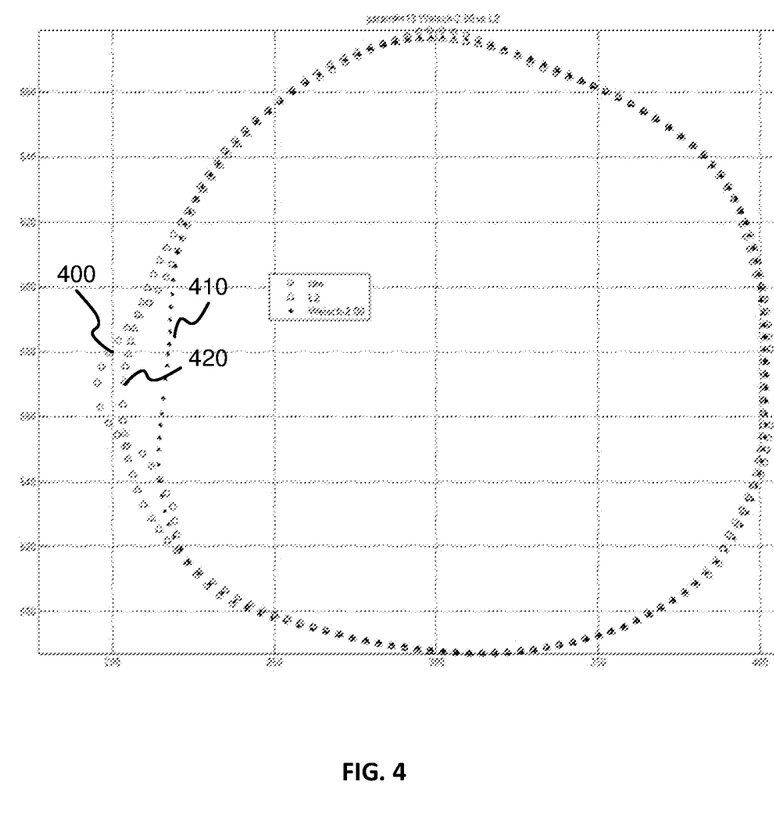
FIG. 4 illustrates an exemplary graph representative of an estimated reference contour in the presence of a local shape deviation in accordance with certain embodiments of the presently disclosed subject matter.

Turning now to FIG. 4, there is illustrated an exemplary graph representative of an estimated reference contour in the presence of a local shape deviation in accordance with certain embodiments of the presently disclosed subject matter.

The structural element in FIG. 4 is exemplified as a contact in a semiconductor specimen, which has a standard shape of an ellipse/a circle. The plot 400 (marked by circle signs in the figure) represents the actual contour of the contact as extracted from the image. As shown from the plot 400, the contact appears to have a local deviation in the shape of pointed protrusion. The plot 410 (marked by dot signs in the figure) represents a first reference contour of the contact which is estimated using the presently disclosed estimation method based on a robust loss function, such as the Welsch loss function. The plot 420 (marked by triangle signs in the figure) represents a second reference contour of the contact which is estimated based on a non-robust loss function such as the LSE loss function.

As illustrated, the first reference contour estimated based on Welsch loss function closely resembles the standard shape (an ellipse/a circle) of the contact, whereas the second reference contour, estimated based on the LSE loss function, is apparently affected by the local deviation which occurred in the actual contour of the contact, thus appearing to deviate from the standard shape of the contact. Therefore, the local deviation, as present in the contact, may not be detected using the second reference contour, as the difference between the actual contour and the second reference contour may not be substantial enough to be detected as a local deviation, whereas by using the first reference contour which is more accurate with respect to the standard shape, the local deviation can be properly detected with respect to the reference, and the amount of deviation can be accurately measured.

Figure 5:
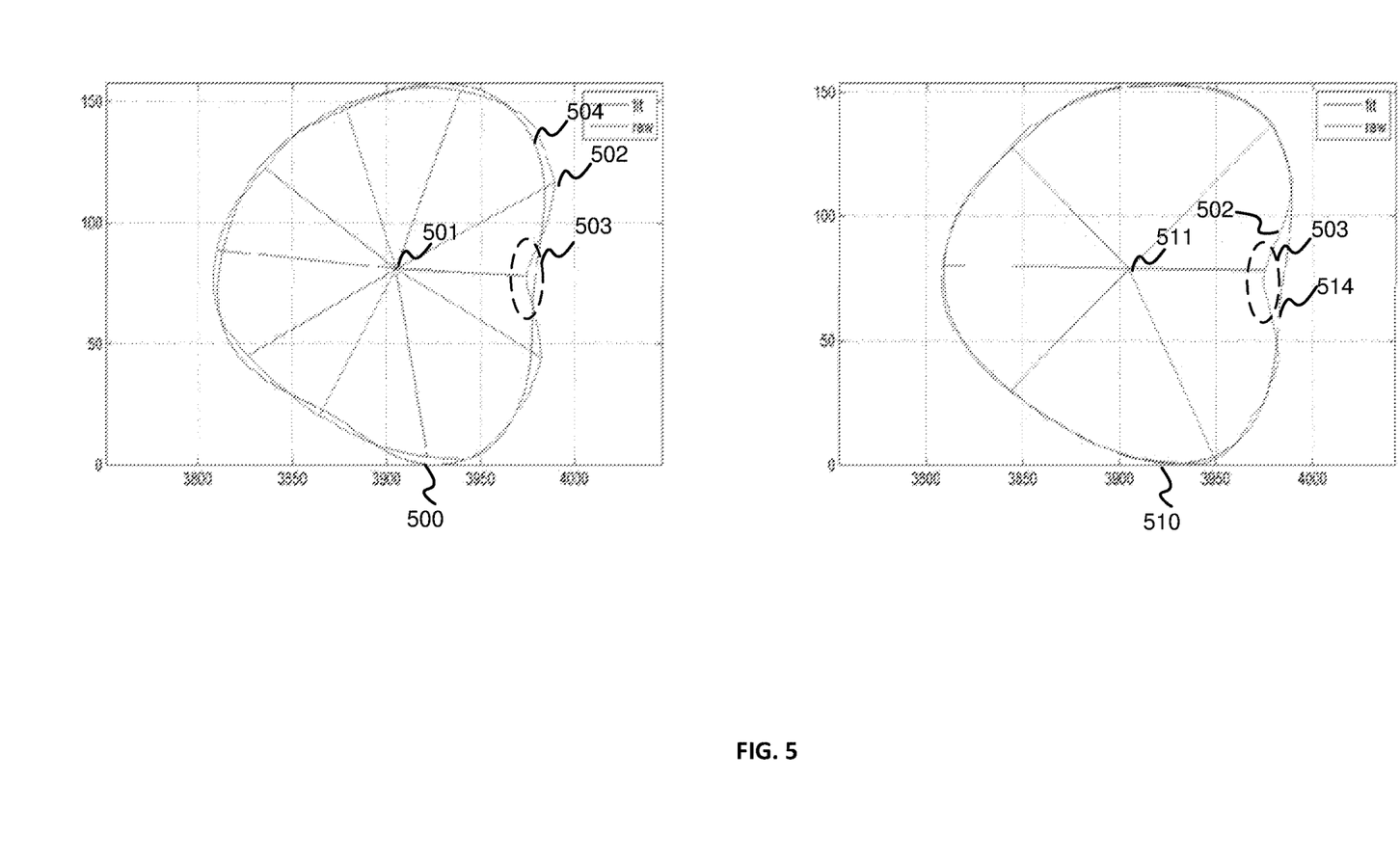
FIG. 5 illustrates examples of local shape deviation measurements in accordance with certain embodiments of the presently disclosed subject matter.

Turning now to FIG. 5, there are illustrated examples of local shape deviation measurements in accordance with certain embodiments of the presently disclosed subject matter.

Graph 500 illustrates the actual contour 502 of a structural element (having a standard shape of a rounded polygon) and the reference contour 504 thereof estimated based on a non-robust (i.e., non-robust to local deviations) loss function such as the L2 loss function. As shown, the structural element has a local deviation 503 in the shape of a rounded dent. Graph 500 further illustrates a plurality of measurements performed on the contours. By way of example, a number of radiuses are derived between the COG 501 of the reference contour and a number of points on the actual contour 502, indicating the locations along the actual contour where certain deviations are detected (the corresponding radiuses of the reference contour and the differences between the radiuses are not marked in the figure due to limitations of illustration).

As shown, since the reference contour 504 was not correctly estimated, differences between the two contours appear in multiple locations along the contours, thus causing multiple false alarms. Although the actual local deviation 503 is detected among the false alarms, since the amplitude of the actual local deviation and the amplitudes of the false alarms are very close to each other due to the incorrect reference contour 502, the actual local deviation may not be able to be identified from the false alarms (e.g., when applying a deviation threshold).

Graph 510 illustrates the actual contour 502 of the same structural element and the reference contour 514 as estimated, using the presently disclosed estimation method based on a Welsch robust loss function. Graph 510 also illustrates a plurality of measurements performed on the contours. By way of example, a number of radiuses are derived between the COG 511 of the reference contour 514 and a number of points on the actual contour 502, indicating the locations along the actual contour where certain deviations are detected. Since the reference contour 514 is accurately estimated, the actual local deviation 503 can be identified from the rest of false alarm deviations, since the amplitude of the actual local deviation differs from the amplitudes of the rest (e.g., when applying a deviation threshold).

According to certain embodiments, the local shape deviation estimation process as described above with reference to FIGS. 2 and 3 can be included as part of an examination recipe usable by system 101 and/or the examination tools 120 for examination of a specimen in runtime, such as, e.g., performing metrology operations with respect to the specimen (referred to as a metrology recipe in such cases). Therefore, the presently disclosed subject matter also includes a system and method for generating an examination recipe during a recipe setup phase, where the recipe comprises the steps as described with reference to FIGS. 2 and 3 (and various embodiments thereof). It is to be noted that the term "examination recipe" should be expansively construed to cover any recipe that can be used by an examination tool for performing operations related to any kind of examination as described above.

It is to be noted that examples illustrated in the present disclosure, such as, e.g., the exemplified structural element of a contact, the exemplified Welsch loss function, the representation of the Fourier series, and the specific ways to measure the deviation as described above, etc., are illustrated for exemplary purposes, and should not be regarded as limiting the present disclosure in any way. Other appropriate examples/implementations can be used in addition to, or in lieu of the above.

It is to be noted that although certain embodiments of the presently disclosed local shape deviation detection process are described with respect to local shape deviations formed in a contact of a 3D-NAND device, this is not intended to limit the presently disclosed process to be applied to only such structural elements and/or such semiconductor specimens. Additionally, the presently disclosed subject matter can be similarly applied to any structural elements and/or or semiconductor specimens that may suffer from such local deviations caused by various physical effects during the fabrication process, irrespective of the specific shape, type or functionality thereof.

Among advantages of certain embodiments of the local shape deviation detection process as described herein is to provide a robust estimation of a standard shape of a structural element which is not affected by the presence of a local shape deviation. This is enabled at least by using a specific Fourier descriptor representative of the reference contour and applying an optimization process to estimate the Fourier descriptor based on a specifically selected robust loss function.

By virtue of the robust estimation of the reference contour indicative of the standard shape, the present disclosure can provide a direct measurement of the local shape deviation which can be differentiated from edge roughness and have better correlation with electrical measurements for advanced process control. Detection of local shape deviation and measurement of the deviation have been proved to have improved accuracy.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

The invention claimed is:

1. A computerized system of detecting a local shape deviation of a structural element in a semiconductor specimen, the system comprising a processing and memory circuitry (PMC) configured to:
   obtain an image comprising an image representation of the structural element;
   extract, from the image, an actual contour of the image representation;
   estimate a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to presence of local shape deviation of the actual contour; and
   perform one or more measurements representative of one or more differences between the actual contour and the reference contour, the measurements being indicative of whether a local shape deviation is present in the structural element.

2. The computerized system according to claim 1, wherein the structural element has a shape selected from a group comprising: an ellipse, an oval, a rectangle, or a combination thereof.

3. The computerized system according to claim 1, wherein the local shape deviation is represented by a local distortion of the actual contour having a relatively substantial deviation with respect to the standard shape of the structural element.

4. The computerized system according to claim 1, wherein the semiconductor specimen is a memory device or a logic device.

5. The computerized system according to claim 1, wherein the actual contour is extracted using an edge detection method.

6. The computerized system according to claim 1, wherein the loss function is Welsch loss function.

7. The computerized system according to claim 1, wherein the PMC is configured to estimate a reference contour by: extracting a first sequence of points from the actual contour, transforming the sequence of points to a Fourier series characterized by a set of Fourier coefficients, optimizing values of a subset of Fourier coefficients selected from the set of Fourier coefficients to minimize the loss function, the subset of Fourier coefficients with the optimized values constituting a Fourier descriptor of the reference contour, and performing an inverse Fourier transform using the Fourier descriptor, giving rise to a second sequence of points constituting the reference contour.

8. The computerized system according to claim 1, wherein each of the one or more measurements is indicative of a difference between a radius of the actual contour and a corresponding radius of the reference contour.

9. The computerized system according to claim 1, wherein the PMC is further configured to apply a deviation threshold to the one or more measurements and report presence of a local shape deviation upon at least one measurement of the one or more measurements passing the deviation threshold.

10. The computerized system according to claim 1, wherein the local shape deviation is caused by a physical effect during a fabrication process of the semiconductor specimen, which, upon being detected, affects one or more electrical measurements of the semiconductor specimen.

11. A computerized method of detecting local shape deviation of a structural element in a semiconductor specimen, the method performed by a processing and memory circuitry (PMC) and comprising:
obtaining an image comprising an image representation of the structural element;
extracting, from the image, an actual contour of the image representation;
estimating a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to presence of local shape deviation of the actual contour; and
performing one or more measurements representative of one or more differences between the actual contour and the reference contour, the measurements being indicative of whether a local shape deviation is present in the structural element.

12. The computerized method according to claim 11, wherein the structural element has a shape selected from a group comprising: an ellipse, an oval, a rectangle, or a combination thereof.

13. The computerized method according to claim 11, wherein the local shape deviation is represented by a local distortion of the actual contour having a relatively substantial deviation with respect to the standard shape of the structural element.

14. The computerized method according to claim 11, wherein the actual contour is extracted using an edge detection method.

15. The computerized method according to claim 11, wherein the loss function is a Welsch loss function.

16. The computerized method according to claim 11, wherein the estimating a reference contour comprises: extracting a first sequence of points from the actual contour, transforming the sequence of points to a Fourier series characterized by a set of Fourier coefficients, optimizing values of a subset of Fourier coefficients selected from the set of Fourier coefficients to minimize the loss function, the subset of Fourier coefficients with the optimized values constituting a Fourier descriptor of the reference contour, and performing an inverse Fourier transform using the Fourier descriptor, giving rise to a second sequence of points constituting the reference contour.

17. The computerized method according to claim 11, wherein each of the one or more measurements is indicative of a difference between a radius of the actual contour and a corresponding radius of the reference contour.

18. The computerized method according to claim 11, further comprising applying a deviation threshold to the one or more measurements and reporting presence of a local shape deviation upon at least one measurement of the one or more measurements passing the deviation threshold.

19. The computerized method according to claim 11, wherein the local shape deviation is caused by a physical effect during a fabrication process of the semiconductor specimen, which, upon being detected, affects one or more electrical measurements of the semiconductor specimen.

20. A non-transitory computer readable storage medium tangibly embodying a program of instructions that, when executed by a computer, cause the computer to perform a method of detecting a local shape deviation of a structural element in a semiconductor specimen, the method comprising:
obtaining an image comprising an image representation of the structural element;
extracting, from the image, an actual contour of the image representation;
estimating a reference contour of the image representation indicative of a standard shape of the structural element, wherein the reference contour is estimated based on a Fourier descriptor representative of the reference contour, the Fourier descriptor being estimated using an optimization method based on a loss function specifically selected to be insensitive to presence of local shape deviation of the actual contour; and
performing one or more measurements representative of one or more differences between the actual contour and the reference contour, the measurements being indicative of whether a local shape deviation is present in the structural element.

* * * * *